US010307724B2

(12) United States Patent
Crnogorac et al.

(10) Patent No.: US 10,307,724 B2
(45) Date of Patent: Jun. 4, 2019

(54) SYSTEMS AND METHODS TO DISPENSE AND MIX REAGENTS

(71) Applicant: Centrillion Technology Holdings Corporation, Grand Cayman, Cayman Islands (KY)

(72) Inventors: Filip Crnogorac, Redwood City, CA (US); Glenn McGall, Palo Alto, CA (US); Bolan Li, Mountain View, CA (US)

(73) Assignee: CENTRILLION TECHNOLOGY HOLDINGS CORPORATION, Grand Cayman (KY)

( * ) Notice: Subject to any disclaimer, the term of this patent is extended or adjusted under 35 U.S.C. 154(b) by 0 days.

(21) Appl. No.: 15/200,408

(22) Filed: Jul. 1, 2016

(65) Prior Publication Data

US 2017/0001165 A1    Jan. 5, 2017

Related U.S. Application Data

(60) Provisional application No. 62/188,374, filed on Jul. 2, 2015.

(51) Int. Cl.
*B05D 3/12* (2006.01)
*B01J 19/00* (2006.01)
(Continued)

(52) U.S. Cl.
CPC ......... *B01J 19/0046* (2013.01); *B05C 11/023* (2013.01); *B05C 11/08* (2013.01);
(Continued)

(58) Field of Classification Search
CPC ..... B05D 1/005; H01L 21/6715; G03F 7/162; B05C 11/08; B05C 11/1039;
(Continued)

(56) References Cited

U.S. PATENT DOCUMENTS 4,029,473 A    6/1977   Sharples
4,068,528 A    1/1978   Gundelfinger
(Continued)

FOREIGN PATENT DOCUMENTS

EP    0947819 A2    10/1999
WO    WO-0141930 A1    6/2001
(Continued)

OTHER PUBLICATIONS

Ausubel, et al., Current protocols in molecular biology. John Wiley &Sons. 1987.
(Continued)

*Primary Examiner* — Kirsten Jolley
(74) *Attorney, Agent, or Firm* — Wilson Sonsini Goodrich Rosati (57) ABSTRACT

The present disclosure provides methods, device, and system for wafer processing. The wafer processing apparatus uses lid dispenser to disperse at least one reagent to the surface of the wafer. Further, the wafer is positioned on top of a rotatable vacuum chuck configured to spread at least one reagent over the surface of the wafer via a centrifugal force or surface tension, thereby permitting the at least one reagent to react with an additional reagent. Further, when dispensing the at least one reagent, a separation gap between the lid dispenser and the wafer is at a predetermined distance, for example, from 50 µm to 2 mm.

7 Claims, 5 Drawing Sheets

(51) Int. Cl.

| | |
|---|---|
| *G03F 7/16* | (2006.01) |
| *B05C 11/02* | (2006.01) |
| *B05C 11/08* | (2006.01) |
| *B05C 11/10* | (2006.01) |
| *B05C 13/00* | (2006.01) |
| *B05D 1/00* | (2006.01) |
| *G03F 7/30* | (2006.01) |
| *C40B 50/18* | (2006.01) |
| *C40B 60/14* | (2006.01) |

(52) U.S. Cl.
CPC .......... *B05C 11/1039* (2013.01); *B05C 13/00* (2013.01); *B05D 1/005* (2013.01); *G03F 7/162* (2013.01); *G03F 7/30* (2013.01); *G03F 7/3014* (2013.01); *B01J 2219/0036* (2013.01); *B01J 2219/00333* (2013.01); *B01J 2219/00421* (2013.01); *B01J 2219/00443* (2013.01); *B01J 2219/00529* (2013.01); *B01J 2219/00536* (2013.01); *B01J 2219/00596* (2013.01); *B01J 2219/00608* (2013.01); *B01J 2219/00612* (2013.01); *B01J 2219/00659* (2013.01); *B01J 2219/00675* (2013.01); *B01J 2219/00691* (2013.01); *B01J 2219/00722* (2013.01); *C40B 50/18* (2013.01); *C40B 60/14* (2013.01)

(58) Field of Classification Search
CPC .......... B01J 19/0046; B01J 2219/00333; B01J 2219/0036; B01J 2219/00421; B01J 2219/00443; C40B 50/18; C40B 60/14
USPC .......................................................... 427/240
See application file for complete search history.

(56) References Cited

U.S. PATENT DOCUMENTS

| | | | |
|---|---|---|---|
| 4,822,569 A | 4/1989 | Pellegrino | |
| 4,889,069 A | 12/1989 | Kawakami | |
| 5,158,751 A | 10/1992 | del Valle et al. | |
| 5,310,523 A | 5/1994 | Smethers et al. | |
| 5,599,501 A | 2/1997 | Carey et al. | |
| 5,695,817 A | 12/1997 | Tateyama et al. | |
| 5,843,527 A | 12/1998 | Sanada | |
| 5,922,288 A | 7/1999 | Herst | |
| 6,162,602 A | 12/2000 | Gautsch | |
| 6,223,453 B1 | 5/2001 | Matheson et al. | |
| 6,247,479 B1 | 6/2001 | Taniyama et al. | |
| 6,379,242 B1 | 4/2002 | Wiseman, Sr. et al. | |
| 6,432,719 B1 | 8/2002 | Vann et al. | |
| 6,484,907 B1 | 11/2002 | Evans | |
| 6,644,364 B1 | 11/2003 | Feygin | |
| 6,660,233 B1 | 12/2003 | Coassin et al. | |
| 6,672,336 B2 | 1/2004 | Nichols | |
| 6,748,975 B2 | 6/2004 | Hartshorne et al. | |
| 6,786,224 B2 | 9/2004 | Wong | |
| 6,786,253 B2 | 9/2004 | Feygin | |
| 6,790,620 B2 | 9/2004 | Bass et al. | |
| 6,870,185 B2 | 3/2005 | Roach et al. | |
| 7,497,995 B2 | 3/2009 | Johnson et al. | |
| 7,618,590 B2 | 11/2009 | Gleason et al. | |
| 7,998,437 B2 | 8/2011 | Berndt et al. | |
| 8,008,080 B2 | 8/2011 | Tokhtuev et al. | |
| 8,097,225 B2 | 1/2012 | Padmanabhan et al. | |
| 8,178,352 B2 | 5/2012 | Tokhtuev et al. | |
| 8,241,013 B2 | 8/2012 | Moeller et al. | |
| 8,286,663 B2 | 10/2012 | Kallback et al. | |
| 8,287,954 B2* | 10/2012 | Yoshihara | G03F 7/162 118/320 |
| 8,536,099 B2 | 9/2013 | Oldham et al. | |
| 8,727,178 B1 | 5/2014 | Carter et al. | |
| 8,956,694 B2* | 2/2015 | Takeguchi | G03F 7/3021 118/320 |
| 9,328,382 B2 | 5/2016 | Drmanac et al. | |
| 2003/0012697 A1 | 1/2003 | Hahn et al. | |
| 2004/0171166 A1 | 9/2004 | Hunter | |
| 2005/0232821 A1 | 10/2005 | Carrillo et al. | |
| 2005/0236051 A1 | 10/2005 | McBeth et al. | |
| 2005/0271814 A1 | 12/2005 | Chang et al. | |
| 2006/0002827 A1 | 1/2006 | Curcio et al. | |
| 2006/0057954 A1 | 3/2006 | Hrebeniuk | |
| 2009/0111168 A1* | 4/2009 | Kim | B01J 19/0046 435/287.1 |
| 2010/0028204 A1 | 2/2010 | Lee et al. | |
| 2010/0047047 A1 | 2/2010 | Mayer et al. | |
| 2010/0276617 A1 | 11/2010 | Yasunaga | |
| 2011/0088727 A1 | 4/2011 | Slowe | |
| 2012/0028811 A1 | 2/2012 | Craighead et al. | |
| 2014/0038854 A1 | 2/2014 | Roth et al. | |
| 2014/0186940 A1 | 7/2014 | Goel | |
| 2015/0343484 A1* | 12/2015 | Kukas | B05C 11/08 118/52 |
| 2016/0046985 A1 | 2/2016 | Drmanac et al. | |
| 2016/0168632 A1 | 6/2016 | Edwards | |
| 2017/0022554 A1 | 1/2017 | Drmanac et al. | |
| 2017/0128944 A1 | 5/2017 | Cheng et al. | |

FOREIGN PATENT DOCUMENTS

| | | |
|---|---|---|
| WO | WO-2008022332 A2 | 2/2008 |
| WO | WO-2009034181 A2 | 3/2009 |
| WO | WO-2012106546 A2 | 8/2012 |
| WO | WO-2015017759 A1 | 2/2015 |

OTHER PUBLICATIONS

Birren, et al., Genome analysis: a laboratory manual, Cold spring harbor laboratory press. 1999.
Eckstein, F., Oligonucleotides and analogues: a practical approach, IRL. 1991.
Gait, MJ., Oligonucleotide Synthesis: A Practical approach, IRL Press. 1984.
International Search Report and Written Opinion dated Sep. 16, 2016 for International Application PCT/US2016/040661.
Maniatis, et al., Molecular Cloning: A Laboratory Manual. Cold Spring Harbor Laboratory Press; 1982.
Sambrook, et al., Molecular Cloning: A Laboratory Manual. 2nd edition. Cold spring harbor laboratory press. 1989.
"European search report with written opinion dated Nov. 15, 2016 for EP16177654.7".
International search report with written opinion dated Dec. 3, 2015 for PCT/US2015/038777.
Ogilvie, et al. Solvent Processing of PMMA and COC Chips for Bonding Device with Optical Quality Surfaces. 14th International Conference on Miniaturized Systems for Chemistry and Life Sciences, Oct. 3-7, 2010, Groningen, The Netherlands.
EP16177654.7 Office Action dated Jul. 16, 2018.

* cited by examiner

SYSTEMS AND METHODS TO DISPENSE AND MIX REAGENTS

CROSS-REFERENCE

This application claims the benefit of U.S. Provisional Patent Application No. 62/188,374, filed on Jul. 2, 2015, which is entirely incorporated herein by reference.

BACKGROUND OF THE INVENTION

The detection of distinctive nucleic acid sequences in a biological sample is critical in many areas, including identifying microorganisms, diagnosing infectious diseases, detecting genetic abnormalities, identifying biomarker associated with various cancers, rating genetic susceptibility to selected diseases, and evaluating patient's response to medical treatments. Over the years, oligonucleotide-based DNA microarrays are becoming increasingly useful for the analysis of gene expression and single nucleotide polymorphisms. DNA microarrays may become a useful tool for large-scale parallel analyses of genome sequence and gene expression. Current applications of DNA microarrays include global analyses of transcriptional processes, evaluation of clinical course of tumors, and accelerated discovery of drug targets.

One way to fabricate DNA microarray is to spot DNA onto nylon membranes or glass slides by robots with pins or ink jet printers. This usually involves naturally available DNA molecules or fragments thereof. When the require DNA sequences are not naturally available, oligonucleotides may be synthesized de novo on the solid surface of the array in a controlled manner. Accordingly, new system and methods to allow controlled chemical synthesis on a solid surface are of interest in the biomedical and biopharmaceutical field.

SUMMARY OF THE INVENTION

The present disclosure provides methods, devices and systems for automated high throughput synthesis of chemical entities using low volume chemical reagents on a substrate, for example, in the synthesis of oligonucleotides on a wafer.

An aspect of the present disclosure provides a wafer processing apparatus comprising: a wafer conveyance robot configured to move a first wafer from a first position to a second position; a vacuum chuck at the second position, the vacuum chuck rotatably holding the first wafer; a lid dispenser at the second position, the lid dispenser aligned with the first wafer along a vertical axis at the center of the first wafer; a nozzle provided by the lid dispenser and above the first wafer, the nozzle dispensing at least one reagent onto a surface of the first wafer when the first wafer is stationary; wherein the vacuum chuck is configured to rotate the first wafer to mix the at least one reagent with an additional reagent over the surface of the first wafer.

In some embodiments of aspects provided herein, when the at least one reagent is dispensed onto the surface of the first wafer, a separation gap (i.e., the thickness of the gap) between the lid dispenser and the first wafer ranges from 50 µm to 2 mm.

In some embodiments of aspects provided herein, the wafer processing apparatus further comprises a first wafer cassette at the first position, the first wafer cassette being configured to hold at least one second wafer. In some embodiments of aspects provided herein, the wafer processing apparatus further comprises a second wafer cassette at a third position, the second wafer cassette being configured to hold at least one third wafer. In some embodiments of aspects provided herein, the wafer conveyance robot is configured to move the first wafer from the second position to the third position.

In some embodiments of aspects provided herein, wherein the at least one second wafer includes the first wafer.

In some embodiments of aspects provided herein, the wafer processing apparatus further comprises an inert atmosphere chamber, the inert atmosphere chamber enclosing the first wafer and the lid dispenser, the inert atmosphere chamber comprising an air inlet and an air outlet, wherein an inert air being introduced into the inert atmosphere chamber through the air inlet and being released out of the inert atmosphere chamber through the air outlet.

In some embodiments of aspects provided herein, wherein at least one relief pattern is implemented on a bottom surface of the lid dispenser or at least one ultrasonic module is implemented within the wafer processing apparatus.

In some embodiments of aspects provided herein, the wafer processing apparatus further comprises a processor for controlling the dispensing of the at least one reagent.

In some embodiments of aspects provided herein, the vacuum chuck rotates the first wafer at a rotational speed of from 1 rpm to 50 rpm, from 51 rpm to 100 rpm, from 101 rpm to 200 rpm, from 201 rpm to 500 rpm, from 501 rpm to 1,000 rpm, from 1,001 to 2,000 rpm, and from 2,001 to 3,000 rpm.

In some embodiments of aspects provided herein, the wafer processing apparatus further comprises a plurality of containers for holding the at least one reagent, wherein the nozzle is in flow communication and operatively associated with each container that selectively and sequentially dispenses an amount of at least one reagent.

In some embodiments of aspects provided herein, the wafer processing apparatus further comprises a drain line under the wafer, the drain line is configured to drain excess at least one reagent.

In some embodiments of aspects provided herein, the wafer processing apparatus further comprises an outlet tube on the lid dispenser, the outlet tube is configured to suck up and drain excess at least one reagent.

In some embodiments of aspects provided herein, the at least one reagent includes a phosphoramidite reagent.

Another aspect of the present disclosure provides method for processing a wafer, comprising: (a) providing a first wafer; (b) moving the first wafer from a first position to a second position by a wafer conveyance robot; (c) placing the first wafer on top of a vacuum chuck at the second position, the vacuum chuck rotatably holding the first wafer; (d) dispensing at least one reagent onto a surface of the first wafer by a nozzle in a lid dispenser at the second position when the first wafer is stationary; wherein the vacuum chuck is configured to rotate the first wafer to mix the at least one reagent with an additional reagent over the surface of the first wafer.

In some embodiments of aspects provided herein, wherein when the at least one reagent is dispensed onto the surface of the first wafer, a separation gap between the lid dispenser and the first wafer ranges from 50 µm to 2 mm.

In some embodiments of aspects provided herein, wherein moving the first wafer from the first position comprises removing the first wafer from a first wafer cassette at the first position.

In some embodiments of aspects provided herein, the method further comprises enclosing the first wafer and the lid dispenser with an inert atmosphere chamber.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

Incorporation by Reference

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION OF THE INVENTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Microarrays of de novo synthesized oligonucleotides offer a number of advantages over other types of DNA microarrays, including (i) more controlled specificity of hybridization, which makes them particularly useful for the analysis of single nucleotide polymorphisms or mutational analysis; (ii) versatility to address questions about transcriptome composition such as the presence and prevalence of alternatively spliced or alternatively polyadenylated transcripts; (iii) capacity to systematically screen whole genomic regions for gene discovery; and (iv) ability to generate sequence information independent of biological samples when manufacturing custom-made microarrays.

However, manufacturing custom-made oligonucleotides microarrays may require inert and controlled environment due to the presence of air- and/or moisture-sensitive reagents in oligonucleotide synthesis. Further, chemical synthesis on a solid surface may require the use of large quantity of such air- and/or moisture-sensitive reagents, which may increase the cost of the manufacture or prolong the average turnover time for the manufacture of wafers. Finally, because oligonucleotide synthesis requires the repetition of similar synthetic manipulations with different reagents, contamination by reagent leftovers may present a problem.

After much effort in experimentation, Applicants have found a new system and method for the fabrication of wafers with de novo synthesis of oligonucleotides. In addition, the new system and method may allow automated high throughput manufacturing of wafers involving reduced volume/amount of chemical reagents.

Definitions

All terms are intended to be understood as they would be understood by a person skilled in the art. Unless defined otherwise, all technical and scientific terms used herein have the same meaning as commonly understood by one of ordinary skill in the art to which the invention pertains. The following definitions supplement those in the art and are directed to the present disclosure and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a molecule" includes a plurality of such molecules, and the like.

The term "fragment" as used herein generally refers to a fraction of the original DNA sequence or RNA sequence of the particular region.

The term "nucleic acid sequence" or "nucleotide sequence" as used herein refers to nucleic acid molecules with a given sequence of nucleotides, of which it may be desired to know the presence or amount. The nucleotide sequence can comprise ribonucleic acid (RNA) or DNA, or a sequence derived from RNA or DNA. Examples of nucleotide sequences are sequences corresponding to natural or synthetic RNA or DNA including genomic DNA and messenger RNA. The length of the sequence can be any length that can be amplified into nucleic acid amplification products, or amplicons, for example up to about 20, 50, 100, 200, 300, 400, 500, 600, 700, 800, 1,000, 1,200, 1,500, 2,000, 5,000, 10,000 or more than 10,000 nucleotides in length.

The term "about" or "nearly" as used herein generally refers to within +/−15%, 10%, 9%, 8%, 7%, 6%, 5%, 4%, 3%, 2%, or 1% of the designated amount.

All words of approximation as used herein should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "substantially", "closely approximate", etc. For example, the term "substantially" includes "reasonably close to: nearly, almost, about", connoting a term of approximation known to a person skilled in the art.

A "polynucleotide sequence" or "nucleotide sequence" or "a sequence of a nucleic acid" is a polymer of nucleotides (an oligonucleotide, a DNA, a nucleic acid, etc.) or a character string representing a nucleotide polymer, depending on context. From any specified polynucleotide sequence, either the given nucleic acid or the complementary polynucleotide sequence (e.g., the complementary nucleic acid) can be determined.

The term "array" as used herein, when describing a device, a system, sensors, sample chambers, etc., refers to a one-dimensional or two-dimensional set of microstructures. An array may be any shape. For example, an array may be a series of microstructures arranged in a line, such as the array of squares. An array may be arranged in a square or rectangular grid. There may be sections of the array that are separated from other sections of the array by spaces. An array may have other shapes. For example, an array may be a series of microstructures arranged in a series of concentric circles, in a series of concentric squares, a series of concentric triangles, a series of curves, etc. The spacing between sections of an array or between microstructures in any array may be regular or may be different between particular sections or between particular pairs of microstructures. The microstructure arrays of the present invention may be comprised of microstructures having zero-dimensional, one-dimensional or two-dimensional shapes. The microstructures having two-dimensional shapes may have shapes such as squares, rectangles, circles, parallelograms, pentagons, hexagons, irregular shapes, etc.

The terms "plate" and "substrate" as used herein, denote the solid portion of an apparatus whose surface is used to synthesize oligonucleotides or conduct chemical reactions.

A characteristic of a "thin-film," as disclosed herein, is that a layer of mobile phase, solution or liquid is spread over a surface of a plate through the action of surface tension, and/or adhesion to the surface of the plate, and/or centrifugal force. Preferably, a thin film is a liquid sample in which the diffusion time is no more than about four-fold greater, more preferably no more than about three-fold greater, more preferably no more than about two-fold greater, more preferably no more than about one-fold greater in one dimension than that in any other dimension. Preferably, the temperature conductance characteristics of a thin film sample are no more than about four-fold greater, more preferably no more than about three-fold greater, more preferably no more than about two-fold greater, even more preferably no more than about one-fold greater in one dimension than that in any other dimension.

The term "processor," as used herein, refers to a personal computer with associated memory. The processor would have sufficient transient RAM memory, non-transient storage memory, processing power, and hardware, such as interface cards to run the associated control software, interface with and operate the automated components of the apparatus, such as the various pumps, motors, valves, sensors, and detectors, and record the values from the sensors, probes and detectors.

The term "wafer" as used herein, refers to a plate, substrate, or semiconductor chip. The diameter of a wafer can be, for example, about 50 mm, about 100 mm, about 150 mm, about 200 mm, about 250 mm, or other lengths.

Devices and Methods

The present disclosure provides methods, devices, and systems to enable fabrication of an array of oligonucleotide on the surface of a plate. The methods, device, and systems of the present disclosure can comprise components including, but not limited to:

1. Wafer cassette, which can hold a plurality of wafers. Wafers can be placed into and out of the wafer cassette.

2. Wafer conveyance robot, which can retrieve a specific wafer from a first wafer cassette, transfer the wafer to at least one pre-determined location; and replace the wafer to a second wafer cassette. The wafer conveyance robot comprises at least one motor, at least one movable arm, and a wafer holder attached to the end of one arm. The wafer conveyance robot can move horizontally and vertically with the help of the motor(s).

3. Vacuum chuck, which can be a vacuum suction type to secure a wafer during the chemical synthesis. It may comprise at least two side arms or at least four side arms to facilitate the positioning of the wafer on top of the vacuum chuck. The vacuum chuck is not limited as long as the chuck can vacuum-suck and hold an object to be sucked and held via a mechanism of a vacuum pump.

4. Rotary shaft for the vacuum chuck, which is rotatably operated by a motor. The rotary shaft for the vacuum chuck can rotate the vacuum chuck at a pre-determined rotational speed of, for example, 1-50 rpm, 51-100 rpm, 101-200 rpm, 201-500 rpm, 501-1,000 rpm, 1,001 rpm to 2,000 rpm, 2,001 rpm to 3,000 rpm, or more than 3,000 rpm. Further, the rotary shaft can be raised or lowered vertically, if desired and equipped with another motor. After reagents has filled the reaction chamber (described below), due to the rotation of the wafer, reagents, including solution and liquid, on the top surface of the wafer may be substantially spread over the top surface of the wafer via the centrifugal force caused by the rotation. Alternatively, the reagents can be mixed by surface tensions. The reagent thus spread may form a thin film over the top surface of the wafer. The rotational speed of the vacuum chuck can be optimized to achieve a desired effect of spreading and mixing reagents.

5. Lid dispenser, which can be raised or lowered to a desired height by a motor. The lid dispenser may have at least one supporting column connected to either the motor or an arm controlled by the motor. The lid dispenser is in a disk shape. The bottom face of the lid dispenser is facing the top surface of the wafer on the vacuum chuck and substantially covers the top surface of the wafer when the lid dispenser is lowered. In other words, the lid dispenser may align with the wafer along a vertical axis at the center of and perpendicular to the surface of the wafer. The wafer is circular. In the middle of the disk is a nozzle for controlled delivery of reagents to the top surface of the wafer. The reagents may be solution, liquid or gas. The delivery of reagents may be facilitated by compressed air or a pump. The amount and sequence of reagents to be delivery as well as the rate of delivery is controlled by an external controller, for example, a computer or a microprocessor. The vacuum chuck can rotate the first wafer at a rotational speed of 1-50 rpm, 51-100 rpm, 101-200 rpm, 201-500 rpm, 501-1,000 rpm, 1,001 rpm to 2,000 rpm, 2,001 rpm to 3,000 rpm, and more than 3,000 rpm. The wafer processing apparatus can further comprise a plurality of containers for holding the at least one reagent, wherein the nozzle is in flow communication and operatively associated with each container that selectively and sequentially dispenses an amount of at least one reagent. The reagents can be transferred to the nozzle via a conduit or tube on top of the lid dispenser. When the lid dispenser is lowered, the gap distance between the bottom surface of the lid dispenser and the top surface of the wafer can be controlled. The gap distance ranges from 50 µm to 2 mm. The diameter of the lid dispenser is about the diameter of the wafer it covers, longer than the diameter of the wafer, or shorter than the diameter of the wafer.

6. Reaction chamber, which is the space between the lower surface of the lid dispenser and the top surface of the wafer. The reaction chamber is semi-enclosed due to the small gap distance between the two aforementioned surfaces. The range of this gap distance is between 50 µm and 2 mm, and is controlled to allow the spreading and mixing of at least one reagent. For example, if the gap distance is too large, reagents dispersed on the surface of the wafer may flow off the surface due to the gravity of the reagents. On the other hand, if the gap distance is too small, there is not enough volume for the surface reactions to occur. The concentrations of the reagents dispersed can be varied according to the volume of the reaction chamber chosen. The reaction chamber can include an aqueous environment in which a plurality of reagents introduced from the nozzle may be present and enabled to react with each other. For example, a newly delivered reagent onto the surface of the wafer may reaction with functional groups attached to the surface of the wafer. A newly delivered reagent may react with previously delivered reagent(s) staying on the surface of the wafer. Optionally, the lid dispenser, the wafer and the vacuum chuck are placed inside a controlled atmosphere chamber or an inert atmosphere chamber filled with inert air, such as nitrogen or argon. In addition, the controlled atmosphere chamber or the inert atmosphere chamber may have an inert air inlet and an inert air outlet so that a constant air flow is maintained within the controlled atmosphere chamber.

In addition, the device may comprise a computer system to control, for example, the delivery of the reagents, the movement of parts of the device, and other operation of the device.

The components of the apparatus can be made from stainless steel, aluminum, non-ferrous alloys, Teflon®, high density poly ethylene (HDPE), or any other material understood by those of ordinary skill in the art for use in particular applications that may depend on the solution acidity or alkalinity, salinity, temperature, or other chemical or physical properties, as well as the ability to prevent contamination and be properly cleaned between chemical reactions.

Methods, devices, and systems of the present disclosure can employ variants of the above components assembled together to create a system capable of manufacture wafers and conducting surface chemistry on the surface of the wafers.

General Methods

The present disclosure employs, unless otherwise indicated, conventional techniques in photolithography, chemical etching, general machining, microfluidics, organic chemistry, biochemistry, oligonucleotide synthesis and modification, nucleic acid hybridization, molecular biology, microbiology, genetic analysis, recombinant DNA, and related fields as are within the skill of the art. These techniques are described in the references cited herein and are fully explained in the literature. See, for example, Maniatis, Fritsch & Sambrook, MOLECULAR CLONING: A LABORATORY MANUAL, Cold Spring Harbor Laboratory Press (1982); Sambrook, Fritsch & Maniatis, MOLECULAR CLONING: A LABORATORY MANUAL, Second Edition, Cold Spring Harbor Laboratory Press (1989); Ausubel, et al., CURRENT PROTOCOLS IN MOLECULAR BIOLOGY, John Wiley & Sons (1987 and annual updates); Gait (ed.), OLIGONUCLEOTIDE SYNTHESIS: A PRACTICAL APPROACH, IRL Press (1984); Eckstein (ed.), OLIGONUCLEOTIDES AND ANALOGUES: A PRACTICAL APPROACH, IRL Press (1991); Birren et al. (eds.) GENOME ANALYSIS: A LABORATORY MANUAL, Cold Spring Harbor Laboratory Press, 1999.

EXAMPLES

The system and method of a wafer processing apparatus according to the present disclosure will be described below with reference to the drawings.

Figure 1:
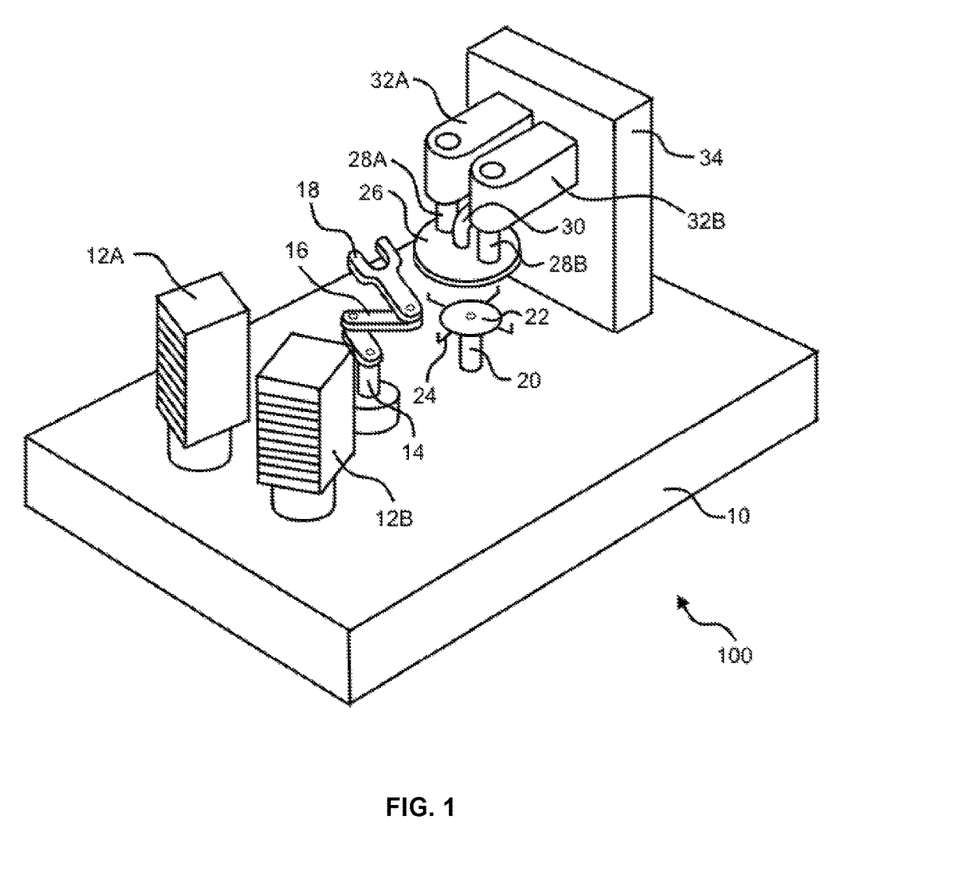
FIG. 1 is a perspective view of a wafer processing apparatus 100 as the embodiment of the present disclosure.

FIG. 1 is a perspective diagram showing the general structures of a wafer processing apparatus 100 according to a first embodiment of the present disclosure. In FIG. 1, a wafer conveyance robot 16 composes a first robot mechanism 14 and a wafer holder 18. The wafer conveyance robot 16 is on a polar coordinate system and disposed on an upper surface of a base 10. Wafer cassettes 12A and 12B, and a vacuum chuck 22 are disposed radially around the wafer conveyance robot 16. The wafer cassettes 12A and 12B, and the vacuum chuck 22 are arranged in a range in which a wafer can be brought in and out from the wafer cassettes 12A and 12B by the wafer conveyance robot 16, and placed on the top of the vacuum chuck 22.

The wafer cassettes 12A and 12B accommodate a plurality of wafers before and after wafer processing. The first robot mechanism 14 can move vertically and horizontally so that a wafer can be brought in and out by the wafer conveyance robot 16, and placed on the top of the vacuum chuck 22. The vacuum chuck 22 may comprise side arms 24 so that when a wafer is placed on top of the vacuum chuck 22 by the wafer holder 18, the wafer is centered on the vacuum chuck 22. A vacuum applied via the vacuum chuck 22 holds the wafer in place and forces the wafer move together with the vacuum chuck 22. Further, the vacuum chuck 22 is positioned on top of a rotary shaft 20 which spins the vacuum chuck 22 together with the wafer vacuum-sucked onto the vacuum chuck 22. The rotary shaft may optionally move vertically to adjust the height of the wafer.

Directly above the vacuum chuck 22 is a lid dispenser 26. The lid dispenser 26 may be in a flat disk shape. The bottom surface of the lid dispenser 26 faces the top surface of the wafer on the vacuum chuck 22 and substantially covers the top surface of the wafer when the lid dispenser 26 is lowered into the position for conducting chemical synthesis. In other words, the lid dispenser 26 may align with the wafer along a vertical axis at the center of and perpendicular to the surface of the wafer. The wafer is circular. There are two supporting columns 28A and 28B holding the lid dispenser 26. The two supporting columns 28A and 28B are connected with a wall portion 34 via side arms 32A and 32B, respectively. The side arms 32A and 32B can move vertically and/or horizontally with the help of robot(s)/motor(s).

The operation of the wafer processing apparatus starts with the removal of one wafer from the wafer cassette 12A by the wafer conveyance robot 16 via the wafer holder 18. Then the wafer conveyance robot 16 places the wafer on top of the vacuum chuck 22. Vacuum is applied to the bottom surface of the wafer which is suction-adhered to the vacuum chuck 22.

Figure 2:
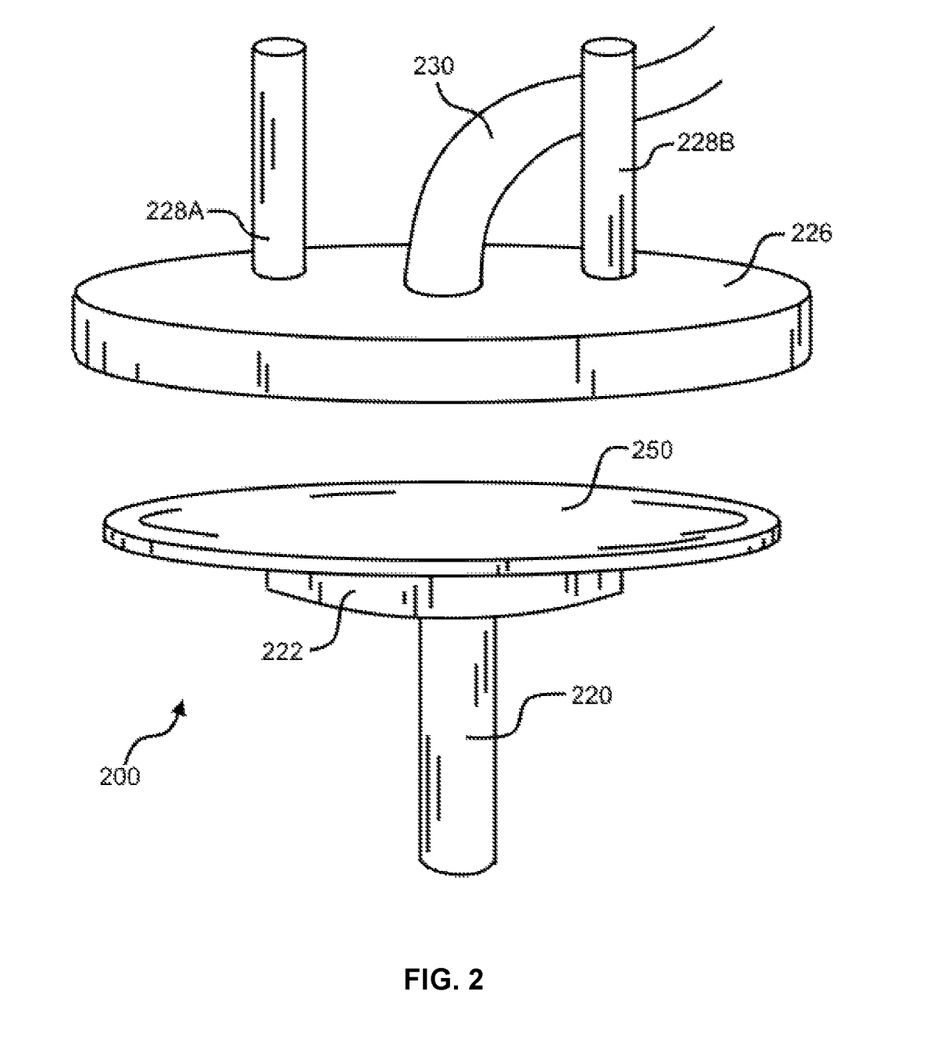
FIG. 2 depicts a partial perspective view of the reaction assembly 200 of a wafer processing apparatus as the embodiment of the present disclosure.

Turning now to FIG. 2, the relative layout of the lid dispenser and the vacuum chuck is shown as reaction assembly 200 according to one embodiment of the present disclosure. The reaction assembly 200 comprises a vacuum chuck 222 positioned on and rotated by a rotary shaft 220. A wafer 250 is placed on top of the vacuum chuck 222 and suction-adhered to the vacuum chuck 222. As a result, when the rotary shaft 220 rotates, so do the vacuum chuck 222 and wafer 250.

The reaction assembly 200 further comprises a lid dispenser 226 on top of the wafer 250. As shown in FIG. 2, the lid dispenser 226 aligns with the wafer 250 along a vertical axis at the center of and perpendicular to the surface of the wafer 250. The wafer 250 and the bottom surface of the lid dispenser 226 are circular. The lid dispenser 226 is movable with the help of two supporting columns 228A and 228B vertically, and optionally, movable on the horizontal plane via another motor. In addition, a conduit or tube 230 is inserted in the center of the lid dispenser 226 and delivers reagents to the top surface of the wafer 250 below the lid dispenser 226 in a controlled manner. The conduit or tube 230 can transfer gas, liquid or solution at a predetermined rate and in a predetermined amount. The conduit or tube 230 may be washed or gas dried in-between different deliveries of reagents so that contamination of reagents within the conduit or tube 230 is minimized. The delivery of reagents may be air-propelled or pump-controlled.

When air is used, it is preferably inert air, for example, nitrogen and argon. Added advantages of using inert air to deliver reagents include drying of the conduit or tube 230 between deliveries using the passage of inert air; protection of air- or moisture-sensitive reagents during delivery; maintaining a positive pressure of inert air over the top surface of the wafer 250 during chemical synthesis; and removing excess reagents from the surface of the wafer 250, either by evaporation or by pushing the reagents over the edge of the wafer 250.

Figure 3:
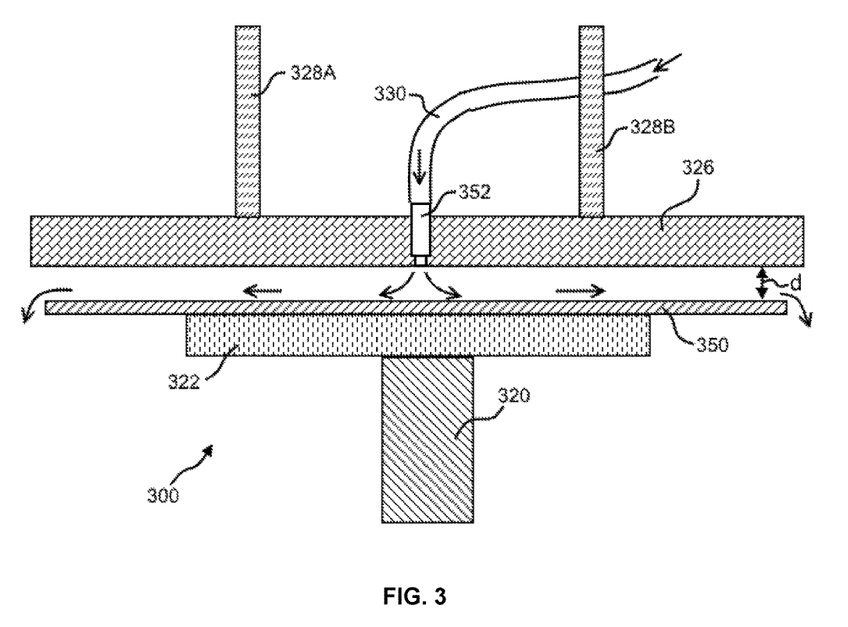
FIG. 3 shows a partial sectional view of the reaction assembly 300 of a wafer processing apparatus as the embodiment of the present disclosure.

Referring to FIG. 3, the relative layout of the lid dispenser and the vacuum chuck is further depicted as reaction assembly 300 according to another embodiment of the present disclosure. In the center of a lid dispenser 326 is a nozzle 352 for controlled delivery of reagents to the top surface of a wafer 350, which is supported and secured by a vacuum chuck 322. The reagents delivered may be solution, liquid or gas. The delivery of reagents may be facilitated by compressed air or a pump. The amount and sequence of reagents to be delivery as well as the rate of delivery is controlled by an external controller, for example, a computer or a microprocessor. The reagents can be transferred to the nozzle 352 via a conduit or tube 330 on the top of the lid dispenser 326. Because the wafer 350 on top of the vacuum chuck 322 is rotated by the rotary shaft 320, reagents dropped onto the center of the wafer 350 will be spread substantially evenly over the top surface of the wafer 350 due to the centrifugal force generated by the rotation. Further, the spin or rotation of the wafer 350 can mix different reagents delivered onto the top surface of the wafer 350. In addition, the spin or rotation of the wafer 350 can spin off excess reagents from the top surface of the wafer 350 by pushing the excess reagent over the edge of the wafer 350. The lid dispenser 326 is movable with the help of supporting columns 328A and 328B vertically, and optionally movable on the horizontal plane via another motor.

When the lid dispenser 326 is lowered, the gap distance d between the bottom surface of the lid dispenser 326 and the top surface of the wafer 350 can be controlled. The gap distance d between the top surface of the wafer 350 and the bottom surface of the lid dispenser 326 ranges from 50 μm to 2 mm. The diameter of the lid dispenser 326 is about the diameter of the wafer 350 it covers, longer than the diameter of the wafer 350, or shorter than the diameter of the wafer 350. In a preferred embodiment, the diameter of the lid dispenser 326 is longer than the diameter of the wafer 350. The diameter of the wafer 350 can be, for example, about 50 mm, about 100 mm, about 150 mm, about 200 mm, about 250 mm, or other lengths.

Reagents, gas, liquid or solution, are introduced into the conduit or tube 330 in a controlled manner. The nozzle 352 delivers the reagents onto the top surface of the wafer 350 when the wafer 350 is stationary. Liquid reagents may spread by capillary action without spinning the wafer 350. After the reaction chamber has been filled with reagents, the wafer 350 may spin to mix the reagents in the reaction chamber. Due to the centrifugation of the rotating wafer, the delivered reagents may form a substantially flat surface, e.g., forming a thin-film. The series of arrows with thin arrowheads in FIG. 3 show the general direction of the reagents in the conduit or tube 330 and the nozzle 352, and the directions of the reagent's flowing patterns once delivered onto the top surface of the wafer 350.

Figure 4:
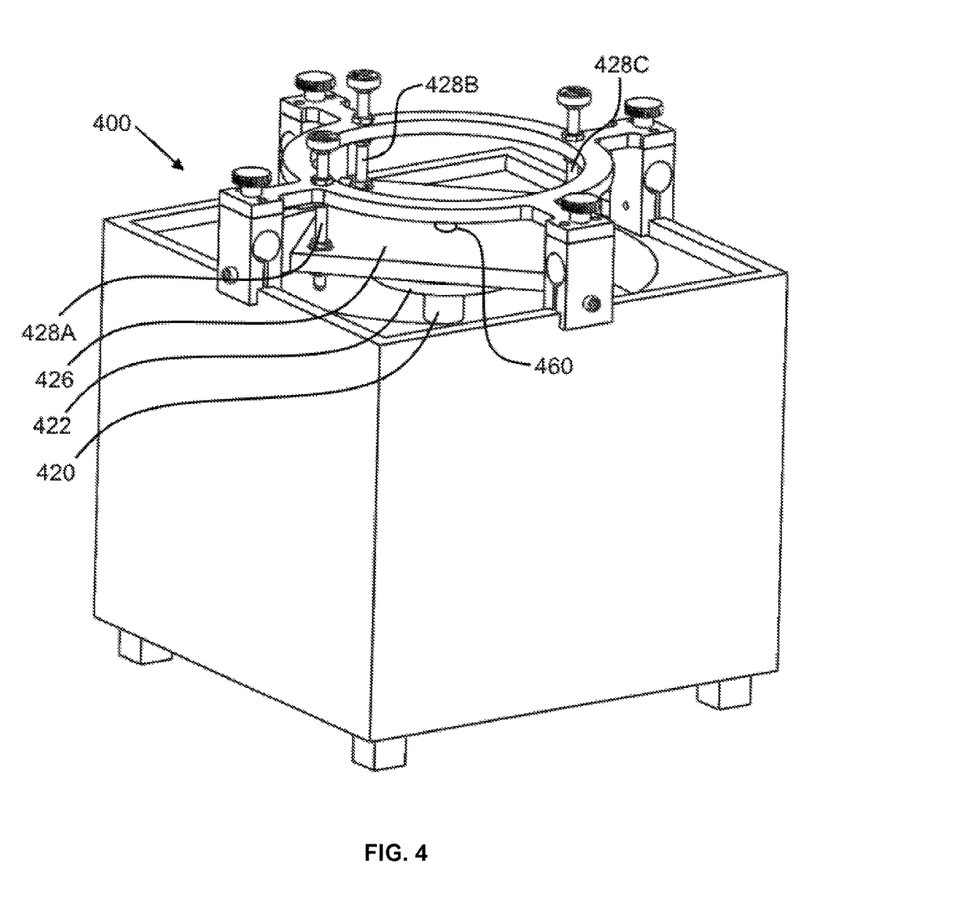
FIGS. 4 and 5 illustrate partial, perspective views of the reaction assembly 400 of a wafer processing apparatus as the embodiment of the present disclosure.
Figure 5:
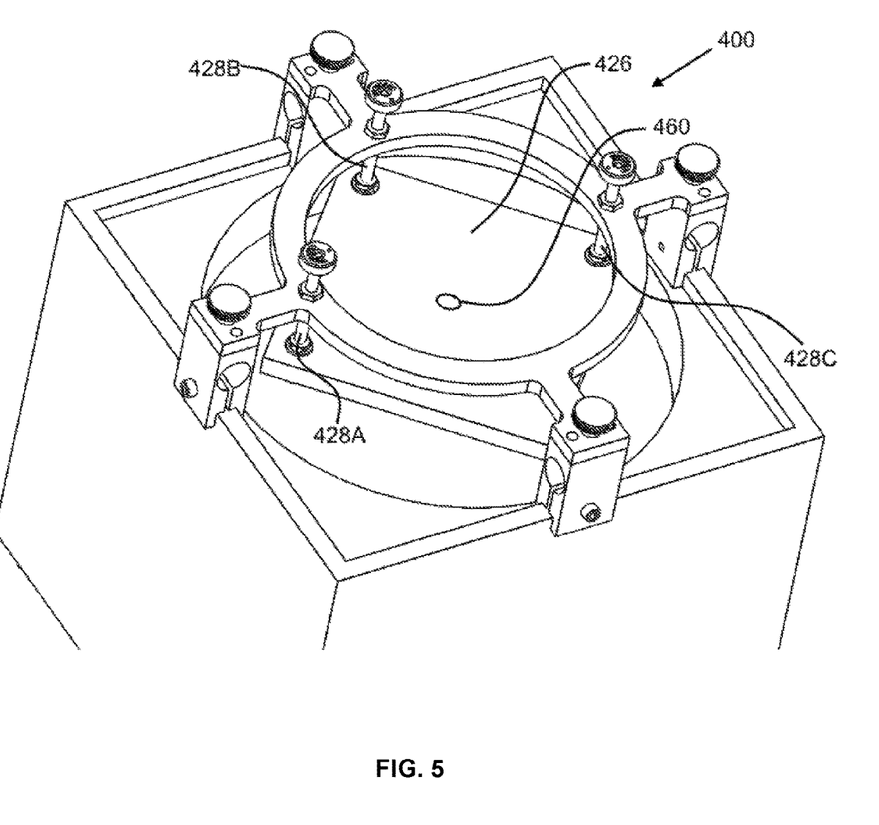

Turning now to FIGS. 4-5, a partial, perspective graphical depiction of a reaction assembly 400 is illustrated according to another embodiment of the present disclosure. A lid dispenser 426 is movable with the help of supporting columns 428A, 428B and 428C vertically. In the center of the lid dispenser 426 is a hole 460, through which a nozzle and/or an inlet tube can be inserted to dispense at least one reagent in a controlled manner. Underneath the lid dispenser 426 is a vacuum chuck 422 configured to support and secure a wafer, onto whose surface the nozzle can deliver the at least one reagent. The vacuum chuck 422 is rotatable by a rotary shaft 420.

After chemical processing of the wafer is completed, the wafer may be dried by either continuous inert air flow or continuous spin. When the wafer is considered dry enough, turning back to FIG. 1, the vacuum applied by the vacuum chuck 22 is relieved. Then the wafer conveyance robot 16 removes the processed wafer from the top of the vacuum chuck 22 to the inside of wafer cassette 12B for storage. Finally, the wafer conveyance robot 16 is ready to remove another wafer from wafer cassette 12A for another round of wafer processing.

As shown and explained above, Applicant presented a design that uses a robotically operated system to achieve automated high-throughput fabrication of wafers with minimal user intervention. Alternatively, the wafer conveyance robot may be replaced with a wafer track for wafer transferring tasks.

Further, an independently controlled chemical delivery system via the lid dispenser is used to deliver different chemical reagents onto the center of the surface of the wafer. Spinning of the wafer makes the delivered reagents moving from the center of the surface of the wafer to the edge of the surface of the wafer, thereby provides stirring/mixing of different reagents to facilitate chemical reactions between reagents on the surface of the wafer. Excessive heat or gaseous by-products of the surface reactions may be dispersed by a continuous flow of inert air either through the chemical delivery system or a separate gas inlet/outlet system.

In one embodiment, the lid dispenser has about the same diameter as the wafer below the lid dispenser so that the bottom surface of the lid dispenser and the top surface of the wafer form a semi-enclosed reaction chamber in-between the two surfaces. Chemical reactions happen in this semi-enclosed reaction chamber. The volume of the reaction chamber is equal to the surface area of the wafer times the separation gap between the two surfaces: Volume=$A_{wafer} \times d_{gap}$, wherein $A_{wafer}$ is the surface area of the wafer, and $d_{gap}$ is the gap distance between the two surfaces. This Volume can be considered, approximately, the volume of reagents used in the chemical process because the wafer can only accommodate such a volume of each reagent according to the present disclosure. For example, if the diameter of the wafer is about 150 mm and the separation gap is about 0.5 mm, the volume of the semi-enclosed reaction chamber is about 8 mL. This volume of the reaction chamber is a reduction in reagent volume when compared with puddle drop systems used for polymer resist development. In the puddle drop systems, the volume of reagent used is determined by the meniscus caused by surface tension. Moreover, if reagents used are volatile or sensitive to ambient air or moisture, for example, when phosphoramidites are used, the semi-enclosed reaction chamber according to the present disclosure minimizes evaporation and reduces contamination because only the outer edge of the thin film layer of the reagent on top of the wafer is in contact with ambient air. The exposed surface of the reagent is: Area of exposure=$\pi \times d_{wafer} \times d_{gap}$, wherein $d_{wafer}$ is the diameter of the wafer. The Area of exposure is significantly smaller than that when no lid dispenser or cover stays close to the wafer since the top surface of the thin film on the wafer of the present disclosure is not exposed to ambient air.

In another embodiment, after the reagents permeate the reaction chamber and cover the wafer surface by capillary action or other mechanisms, the wafer can be slowly rotated or spun to ensure that reagents added are mixed, thereby improving uniformity of distribution of the reagents across the surface of the wafer. In addition, the movement of liquid against a stationary bottom surface of the lid dispenser can provide some reagent mixing. Alternatively, relief patterns can be implemented on the bottom surface of the lid dispenser, or ultrasonic module(s) can be added to the reaction chamber, so that reagent mixing can be improved.

In one embodiment, there is no outlet port for the delivered chemicals. Excess chemicals can be either spun off the edge of the wafer at higher rotational speeds of the rotary shaft, pushed off the edge by the delivery of the next chemical reagent, pushed through by a puff of a processing inert gas, or any combination of the above methods. Further, process optimization to control the volume of reaction added or vacuum chuck design with a chemical waste collection portion underneath the vacuum chuck can prevent used or discarded chemicals from dripping onto the bottom surface of the wafer. In addition, additional outlet(s) may be added at the base 10 to remove spun-off or discarded chemicals. Similarly, at the completion of the wafer processing, the wafer can be spun dry with a wider, pre-determined separation gap between the two surfaces, dried at an elevated temperature, or blown dried by a process gas from the lid dispenser, or a combination of the above. Alternatively, an outlet tube can be inserted into the lid dispenser away from the nozzle and the tube (i.e. the inlet tube to deliver reagents) connected to the nozzle. The outlet tube is configured to suck up excess reagents, used up reagents, or reagents remained in liquid forms in a controlled manner (for example, after a predetermined time of mixing/spinning) and transport the sucked-up reagents to a waste container. For example, vacuum can be applied to the outlet tube to suck up reagents. Then the next reagent can be delivered via the inlet tube and the nozzle to fill the reaction chamber.

In another embodiment, the lid dispenser can be cleaned with a flow of wash solution/solvent through the separation gap prior to drying of the bottom surface of the lid dispenser. This ensures minimal contamination between process steps or cross-contamination of reagents.

In one embodiment, for oligonucleotide synthesis application of the present disclosure, Applicants use flexible 3/16" OD FEP tubing to deliver reagents to a machined glass lid dispenser, both of which are inert to the solvents used in the oligonucleotide synthesis. Further, a separation gap of about 0.5 mm is implemented when delivering reagents to the top surface of the wafer with an about 150 mm diameter so that about 8 mL of reagent volume is expected to fill the reaction chamber defined by the bottom surface of the lid dispenser and the top surface of the wafer. All chemical reagent manipulation can be controlled by an external oligosynthesizer or an event management system, which communicates with the reaction chamber to perform desired tasks, including but not limited to, setting up gap distance, rotation speed of the rotary shaft, amount and speed of reagent delivery, etc.

In another embodiment, solvents used as part of the at least one reagent include but are not limited to: DI water, acetonitrile (ACN), trichloromethane (TCM), and THF. The wafer can be a glass wafer. The lid dispenser can be a glass lid dispenser. The shape of the dispenser includes but is not limited to: circular and square. The wafer can be spun up to up to 3,000 rpm with the help of the vacuum chuck and the rotary shaft. The rotation speed can be adjusted to spin off excess reagents from the reaction chamber. For example, spinning at about 1,000 rpm can spin off excess reagents from the reaction chamber.

In one embodiment, in order to make the opposing surfaces of the wafer and the lid dispenser parallel before the addition of the at least one reagent, about 50% of the reaction chamber volume can be filled with water. Subsequently the wafer is spun, for example, at about 20 rpm. The water meniscus in the reaction chamber forms an ellipse or a circle, which can be viewed through the glass lid of the lid dispenser on top of the wafer or by other detecting devices. Then the supporting columns for the lid dispenser can be adjusted manually, mechanically, or automatically to make the observed water meniscus a circle or substantially a circle (instead of an ellipse when viewed from the glass lid on top of the wafer) centered at the rotation axis of the wafer. In this way the gap distance between the opposing surfaces of the lid dispenser and the wafer can be substantially equal or even, and thereby the lid dispenser and the wafer are substantially parallel.

INDUSTRIAL APPLICATION OF THE PRESENT DISCLOSURE

The advantage of the wafer processing apparatus, system and method include:
a) High throughput platform via automated cassette-to-cassette handling
b) No mechanical contact to the top surface of the wafer by robots or other components of the apparatus during wafer processing
c) Low volume of reagent usage which is determined by the separation gap and the delivery rate
d) Minimal reagent loss due to evaporation or contamination because the semi-enclosed nature of the reaction chamber with optional inert air chamber enclosing the reaction chamber
e) Built-in reagent mixing via wafer rotation
f) Ease of wafer drying
g) Self-cleaning, prevention of cross-contamination by different reagents Even though FIGS. 1-5 depict the wafer processing apparatus and its components as having certain relative dimensions, such dimensions are only exemplary and other relative dimensions are possible.

While the invention has been described with reference to certain embodiments, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A method for processing wafers, comprising:
   (a) providing a first wafer;
   (b) moving the first wafer from a first position to a second position by a wafer conveyance robot;
   (c) placing the first wafer on top of a vacuum chuck at the second position, the vacuum chuck rotatably holding the first wafer;
   (d) dispensing at least one reagent into a reaction chamber between a bottom face of a lid dispenser at the second position and a top surface of the first wafer by a nozzle in the lid dispenser when the wafer is stationary; and
   (e) spreading the at least one reagent by capillary action over the top surface of the first wafer such that the reaction chamber is filled with the at least one reagent to form a thin-film, wherein the lid dispenser is not rotated;
   wherein the nozzle is placed above the first wafer and projected at the center of the wafer, and wherein the vacuum chuck is configured to rotate the first wafer to mix the at least one reagent with an additional reagent over the top surface of the first wafer.

2. The method of claim 1, wherein when the at least one reagent is dispensed onto the top surface of the first wafer, a separation gap between the lid dispenser and the first wafer ranges from 50 µm to 2 mm.

3. The method of claim 1, wherein in step (d) prior to dispensing the at least one reagent, dispensing a predetermined amount of liquid onto the top surface of the first wafer by the nozzle, rotating the first wafer at about 20 rpm, adjusting support columns of the lid dispenser to make a bottom surface of the lid dispenser and the top surface of the first wafer substantially parallel.

4. The method of claim 1, wherein the moving the first wafer from the first position comprises removing the first wafer from a first wafer cassette at the first position.

5. The method of claim 1 further comprises enclosing the first wafer and the lid dispenser with an inert atmosphere chamber.

6. The method of claim 1 further comprises (f) draining excess at least one reagent by using a drain line under the wafer, by using an outlet tube in the lid dispenser configured to suck up the excess at least one reagent from the top surface of the first wafer, or by rotating the first wafer up to 1,000 rpm, up to 2,000 rpm or up to 3,000 rpm to spin off excess reagent.

7. The method of claim 1, wherein the at least one reagent includes a phosphoramidite reagent.

* * * * *